(12) United States Patent
Khoshkava et al.

(10) Patent No.: US 10,481,695 B2
(45) Date of Patent: *Nov. 19, 2019

(54) FIBER ACTUATOR FOR HAPTIC FEEDBACK

(71) Applicant: IMMERSION CORPORATION, San Jose, CA (US)

(72) Inventors: Vahid Khoshkava, Montreal (CA); Juan Manuel Cruz Hernandez, Montreal (CA)

(73) Assignee: IMMERSION CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/364,270

(22) Filed: Mar. 26, 2019

(65) Prior Publication Data

US 2019/0235631 A1 Aug. 1, 2019

Related U.S. Application Data

(63) Continuation of application No. 15/966,148, filed on Apr. 30, 2018, now Pat. No. 10,281,985, which is a continuation of application No. 15/454,362, filed on Mar. 9, 2017, now Pat. No. 10,007,347.

(51) Int. Cl.
*G06F 3/01* (2006.01)
*D03D 1/00* (2006.01)
*A63F 13/28* (2014.01)
*H01L 41/08* (2006.01)
*G08B 6/00* (2006.01)

(52) U.S. Cl.
CPC .............. *G06F 3/016* (2013.01); *A63F 13/28* (2014.09); *D03D 1/0088* (2013.01); *G08B 6/00* (2013.01); *H01L 41/082* (2013.01); *G06F 2203/013* (2013.01); *G06F 2203/04809* (2013.01)

(58) Field of Classification Search
CPC ..... D10B 2401/18; G06F 3/016; G06F 1/163; G06F 2203/014; D03D 1/0088
See application file for complete search history.

(56) References Cited

U.S. PATENT DOCUMENTS

| 8,362,882 B2 | 1/2013 | Heubel et al. |
| 8,665,241 B2 | 3/2014 | Heubel et al. |
| 9,058,728 B2 | 6/2015 | Fantauzza |
| 2010/0127932 A1* | 5/2010 | Heikkinen ............. H04B 17/21 342/374 |

(Continued)

FOREIGN PATENT DOCUMENTS

| EP | 3291317 A1 | 3/2018 |
| WO | 2016175321 A1 | 11/2016 |

OTHER PUBLICATIONS

Behl and Lendlein, "Shape Memory Polymers," MaterialsToday, vol. 10, pp. 20-28 (2007).

(Continued)

*Primary Examiner* — Fabricio M Murillo Garcia
(74) *Attorney, Agent, or Firm* — Medler Ferro Woodhouse & Mills PLLC

(57) ABSTRACT

This disclosure relates to fiber actuators for providing haptic feedback, and haptic actuation resulting from mechanical and/or electrostatic (non-mechanical) interactions with the fiber actuators. Such fiber actuators are useful in structural materials, including as elements of wearables or accessories.

13 Claims, 2 Drawing Sheets

(56) References Cited

U.S. PATENT DOCUMENTS

| | | |
|---|---|---|
| 2010/0141407 A1 | 6/2010 | Heubel et al. |
| 2011/0158297 A1* | 6/2011 | Ding .................. H03D 3/009 |
| | | 375/219 |
| 2012/0028577 A1 | 2/2012 | Rodriguez et al. |
| 2012/0315866 A1* | 12/2012 | Rebel .................. H03B 5/32 |
| | | 455/164.1 |
| 2013/0155020 A1 | 6/2013 | Heubel et al. |
| 2017/0029985 A1 | 2/2017 | Tajitsu et al. |

OTHER PUBLICATIONS

Bellan and Bossis, "Field Dependence of Viscoelastic Properties of MR Elastomers," Int. J. Mod. Phys. B. 16:2447-2453 (2002).
Palleau, et al., "Reversible patterning and actuation of hydrogels by electrically assisted ionoprinting," Nature Communications 4:2257 (2013).
Co-pending U.S. Appl. No. 15/454,399, filed Mar. 9, 2017.

* cited by examiner

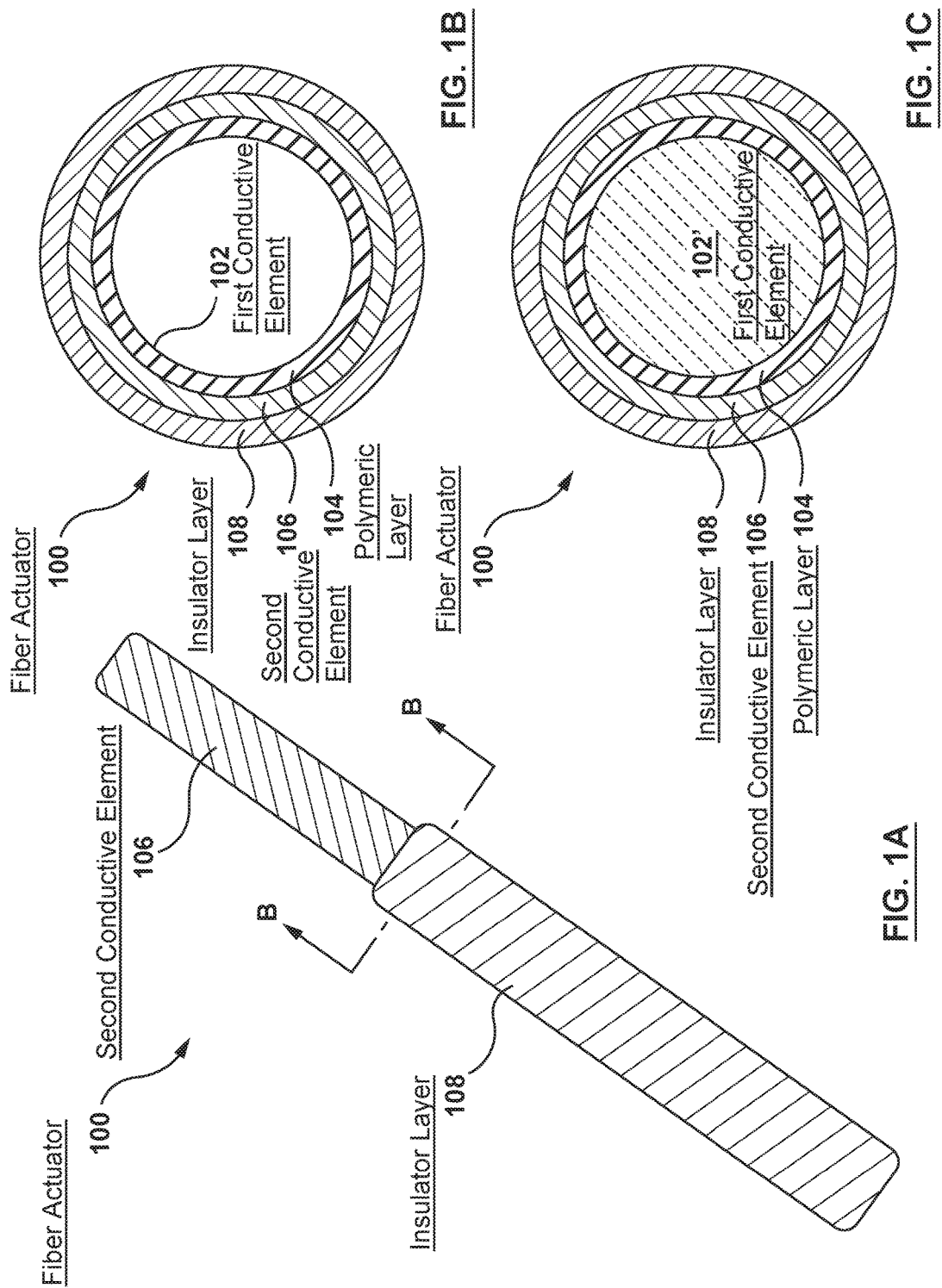

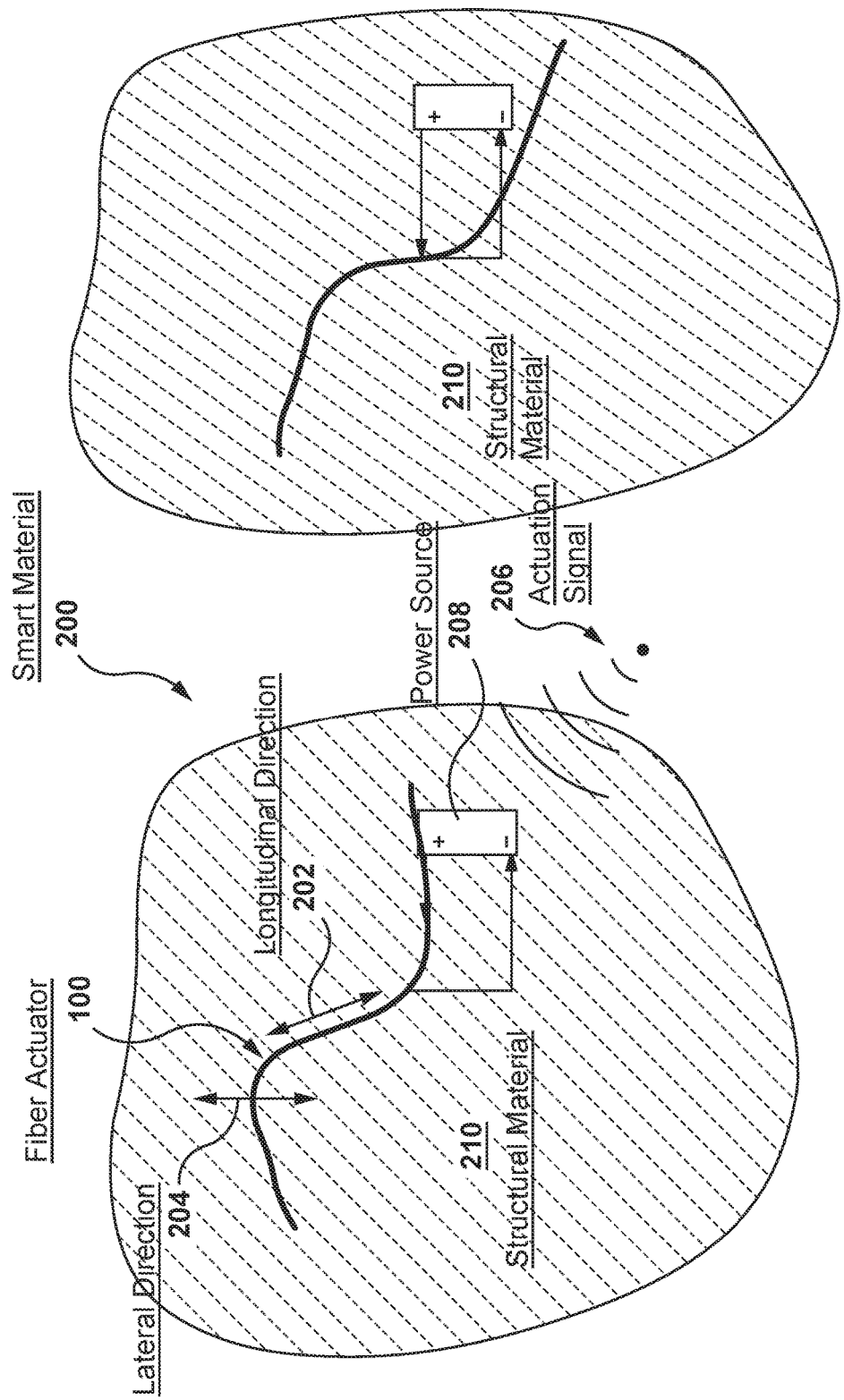

FIBER ACTUATOR FOR HAPTIC FEEDBACK

CROSS-REFERENCE TO RELATED APPLICATIONS

The present application is a continuation of U.S. application Ser. No. 15/966,148, filed Apr. 30, 2018, which is a continuation of U.S. application Ser. No. 15/454,362, filed Mar. 9, 2017, now U.S. Pat. No. 10,007,347, the disclosures of each of which are incorporated by reference herein in their entireties.

TECHNICAL FIELD

This disclosure relates to fiber actuators for providing haptic feedback, and haptic actuation resulting from mechanical and/or electrostatic (non-mechanical) feedback. Such fiber actuators are useful in structural materials, including as elements of wearables or accessories.

BACKGROUND

Haptic feedback for use in wearables or accessories has traditionally been based on the use of eccentric rotating mass (ERM) motors and linear resonant actuators (LRA). However, these types of actuators are typically bulky and often require large amounts of power, making them difficult to integrate into clothing or other wearables or accessories (i.e., jewelry, etc.). Shape memory alloys have also been used in wearables, but again, power consumption often limits their applicability and ease of integration.

What is needed is a simple mechanism for providing haptic feedback to a user that can readily be implemented in wearable and accessory goods.

SUMMARY

This disclosure relates to fiber actuators for providing haptic feedback, wherein the fiber actuator may be used in various applications, such as wearables and accessory goods.

In exemplary embodiments, provided herein are fiber actuators for providing haptic feedback to a user. Fiber actuators include, for example, a first conductive element, a polymeric layer concentrically disposed about the first conductive element and configured to deform so as to provide haptic feedback, and a second conductive element concentrically disposed about the polymeric layer. In embodiments, the fiber actuator has a substantially circular cross-section for substantially an entire length thereof.

Also provided herein are smart materials for providing haptic feedback, which include, a structural material, and a fiber actuator associated with the structural material, which includes a first conductive element, a polymeric layer concentrically disposed about the first conductive element and configured to deform so as to provide haptic feedback, and a second conductive element concentrically disposed about the polymeric layer. Suitably, the fiber actuator has a substantially circular cross-section for substantially an entire length thereof.

Also provided herein are methods for providing haptic feedback to a user via a fiber actuator. The methods suitably include providing a fiber actuator as described herein, transmitting an actuation signal to a power source electrically coupled to the fiber actuator, and generating haptic feedback via the fiber actuator.

BRIEF DESCRIPTION OF THE DRAWINGS

The foregoing and other features and aspects of the present technology can be better understood from the following description of embodiments and as illustrated in the accompanying drawings. The accompanying drawings, which are incorporated herein and form a part of the specification, further serve to illustrate the principles of the present technology. The components in the drawings are not necessarily to scale.

FIG. 1A shows a fiber actuator in accordance with an embodiment hereof.

FIG. 1B shows a sectional view of an exemplary fiber actuator of FIG. 1A, taken through line B-B, in accordance with an embodiment hereof.

FIG. 1C shows a section view of an alterative fiber actuator of FIG. 1A, taken through line B-B, in accordance with an embodiment hereof.

FIGS. 2A-2B show a smart material for providing haptic feedback in accordance with an embodiment hereof.

DETAILED DESCRIPTION

Various embodiments will be described in detail, some with reference to the drawings. Reference to various embodiments does not limit the scope of the claims attached hereto. Additionally, any embodiments set forth in this specification are not intended to be limiting and merely set forth some of the many possible embodiments for the appended claims.

Whenever appropriate, terms used in the singular also will include the plural and vice versa. The use of "a" herein means "one or more" unless stated otherwise or where the use of "one or more" is clearly inappropriate. The use of "or" means "and/or" unless stated otherwise. The use of "comprise," "comprises," "comprising," "include," "includes," "including," "has," and "having" are interchangeable and not intended to be limiting. The term "such as" also is not intended to be limiting. For example, the term "including" shall mean "including, but not limited to."

In embodiments, provided herein are fiber actuators for providing haptic feedback, which include a first conductive element, a polymeric layer concentrically disposed about the first conductive element and configured to deform so as to provide haptic feedback, and a second conductive element concentrically disposed about the polymeric layer.

In further embodiments, provided herein are smart materials for providing haptic feedback to a user, which include a structural material and a fiber actuator, as described herein.

As used herein "fiber actuator(s)" refers to a material having a cross-section that is substantially circular, and a length that is at least 2 or more times greater than its cross-section. In embodiments, the fiber actuators contain an inner or core material, which is surrounded, concentrically, by one or more layers of additional materials.

As used herein "smart material(s)" refers to a material that is capable of being controlled such that the response and properties of the material change under the influence of an external stimulus.

As used herein "haptic feedback" or "haptic feedback signal" refer to information such as vibration, texture, and/or heat, etc., that are transferred, via the sense of touch, from a fiber actuator and/or smart material as described herein, to a user.

As used herein, "structural material" means a material used in constructing a wearable, personal accessory, luggage, etc. Examples of structural materials include: fabrics and textiles, such as cotton, silk, wool, nylon, rayon, synthetics, flannel, linen, polyester, woven or blends of such fabrics, etc.; leather; suede; pliable metallic such as foil; Kevlar, etc. Examples of wearables include: clothing; footwear; prosthetics such as artificial limbs; headwear such as hats and helmets; athletic equipment worn on the body; protective equipment such as ballistic vests, helmets, and other body armor. Personal accessories include: eyeglasses; neckties and scarfs; belts and suspenders; jewelry such as bracelets, necklaces, and watches (including watch bands and straps); and wallets, billfolds, luggage tags, etc. Luggage includes: handbags, purses, travel bags, suitcases, backpacks, and including handles for such articles, etc.

FIG. 1A illustrates an exemplary fiber actuator 100 as described herein. FIG. 1B shows a section through line B-B of fiber actuator 100, in which a hollow core fiber is utilized or employed. FIG. 1C shows a cross-section through line B-B of fiber actuator 100, in which a solid core fiber is utilized or employed. In embodiments, as shown in FIG. 1B, fiber actuator 100 includes a first conductive element 102. In such embodiments, first conductive element 102 forms a hollow core of fiber actuator 100, forming a substantially circular cross-section of the fiber actuator. In FIG. 1C, first conductive element 102' is a solid core of fiber actuator 100, forming a substantially circular cross-section of the fiber actuator.

As shown in FIG. 1B, fiber actuator 100 further includes a polymeric layer 104 concentrically disposed about first conductive element 102 and configured to deform so as to provide haptic feedback. In fiber actuator 100 of FIG. 1B, first conductive element 102 essentially forms a coating or inner lining of polymeric layer 104, thereby providing the hollow core structure of fiber actuator 100. In FIG. 1C, polymeric layer 104 is concentrically disposed about the solid core of first conductive element 102', forming a coating surrounding the solid core structure of fiber actuator 100.

Fiber actuator 100 further includes a second conductive element 106, concentrically disposed about polymeric layer 104. In FIGS. 1A and 1B, second conductive element 106 is represented as a coating or layer surrounding polymeric layer 104.

As described herein, fiber actuator 100, whether including a solid or hollow core structure, has a substantially uniform cross-section for substantially an entire length of the fiber actuator, and in certain embodiments, has a substantially circular cross-section for substantially an entire length of the fiber actuator. It is this substantially uniform cross-section (and in embodiments the substantially circular cross-section) that provides fiber actuator 100 with one of its characteristics to allow for use or integration in structural materials, including wearables, as described herein. "Substantially uniform cross-section" means that a section taken through the fiber has a cross-section that is uniform, i.e., within about 5-10% throughout "substantially an entire length" of the fiber actuator. "Substantially circular cross-section" means that a section taken through the fiber has a diameter that is uniform, i.e., within about 5-10% throughout "substantially an entire length" of the fiber actuator. "Substantially an entire length" means at least 80-90% of the entire length of the fiber actuator. In embodiments, the fiber actuator has a cross-section, and suitably a diameter, that is uniform within about 1-5% (suitably within about 4%, about 3%, about 2% about 1% or about 0.5%) over at least about 90-95%, and suitably 95% or more (e.g., 96%, 97%, 98%, 99% or 100%) of the entire length of the fiber actuator. In further embodiments, other cross-sections (i.e., square, rectangular, triangular, oval, etc.), can also be used that are also substantially uniform, as described herein.

Exemplary conductive elements for use in fiber actuator 100 include, but are not limited to, silver, gold, various conductive metals or polymers, including, Al, Cr, poly(3,4-ethylenedioxythiophene), polystyrene sulfonate (PEDOT:PSS), etc.). In embodiments where the first conductive element forms a solid core, as FIG. 1C, first conductive element 102' can be a solid wire or filament of a conductive element, including a gold or silver wire, etc. Polymeric layer 104 can then be disposed, coated or otherwise associated with the solid core to form the concentrically disposed structure. As used herein "concentrically disposed" refers to a layer(s) of material that is applied or coated on a structure, such that the layers have the same circular center when viewed in cross-section.

In embodiments where the first conductive element forms a hollow core, as in FIG. 1B, the inner surface of polymeric layer 104 can be coated or covered with a film or coating of a metal or other material, to form first conductive element 102. Similarly, second conductive element 106 can also be coated or disposed on polymeric layer 104, thereby forming the structure shown in FIG. 1B. For example, a hollow polymeric fiber or filament can be prepared, using for example, a fiber spinning method wherein concentric cylinders are used, and a polymer fills in the gaps between the cylinders to form a hollow fiber, such as polymeric layer 104. First conductive element 102 can then be applied to the inner surface of polymeric layer 104 to form the hollow fiber structure. Similarly, second conductive element 106 can be applied to the outer surface of the hollow fiber, polymeric layer 104, to form the structure shown in FIG. 1B. Methods of applying first and second conductive elements can include sputtering, dip-coating, spraying, electro-plating, painting, etc. In embodiments, surface patterning can be used to selectively etch the surface of polymeric layer 104 to increase the surface area or create a desired structure which can then be coated or covered with a thin film of conductive material to create the first and/or second conductive elements described herein.

In further embodiments, first 102 and/or second 106 conductive elements can be positioned over certain sections of the fiber actuator, with sections between the conductive elements in a non-active state (i.e., lacking one or more of the conductive elements). Fiber actuator 100 can be prepared with repeated sections of "active"—containing electrode(s) and "inactive,"—lacking electrode(s) to provide a patterned fiber. Such patterning can occur, for example, over a stretch of about 1-5 cm with electrodes, about 1-5 cm without electrodes, and then repeated, etc.

Polymeric layer 104 suitably includes an electroactive polymer. Electroactive polymers include polymers such as, but not limited to, poly(vinylidene fluoride), poly(pyrrole), poly(thiophene), poly(aniline) and mixtures, co-polymers, and derivatives thereof. Exemplary classes of electroactive polymers include dielectric and ionic polymers. A dielectric polymer (or dielectric elastomer) may be made to change shape in response to an electric field being generated between two electrodes that then squeezes the polymer. Dielectric polymers are capable of very high strains and are fundamentally a capacitor that changes its capacitance when a voltage is applied by allowing the polymer to compress in thickness and expand in area due to the electric field. An ionic polymer may undergo a change in shape or size due to displacement of ions inside the polymer. In addition, some ionic polymers require the presence of an aqueous environment to maintain an ionic flow.

Methods of preparing electroactive polymers are known in the art, and can suitably include dissolving a desired polymer in a suitable solvent, and then casting the polymer in the desired shape (i.e., fiber or filament). Alternatively, the polymer may be drawn, or subjected to fiber spinning techniques, so as to be prepared with the desired filament (core or hollow structure) dimensions, as described herein. Additional methods include melt mixing, in which the polymer is heated above the softening/melting point, and then the polymer film is processed using film processing (casting or blowing) techniques.

Polymer layer 104 will suitably have a thickness on the order of about 5 µm to millimeters, e.g., about 1 µm to 5 mm, about 1 µm to 1 mm, about 1 µm to 500 µm, or about 5 µm to about 500 µm, or about 10 µm to 500 µm, or about 1 µm to about 100 µm, though thicker or thinner polymer layers can also be utilized.

First conductive element 102', in the form of a solid core structure, can have a diameter on the order of 5 µm to millimeters, e.g., about 1 µm to 10 mm, about 1 µm to 5 mm, about 1 µm to 1 mm, about 1 µm to 500 µm, or about 5 µm to about 500 µm, or about 10 µm to 500 µm, or about 1 µm to about 100 µm. When first conductive element is in the form of a coating or layer, as in FIG. 1B, the thickness of the conductive element will generally be on the order of microns, suitably about 0.5 µm to about 500 µm, more suitably about 0.5 µm to about 100 µm, or about 0.5 µm to about 50 µm.

Overall, the diameter of the fiber actuators 100 described herein is suitably on the order of 10's to 100's of microns, or up to millimeters, for example, on the order of about 1 µm to 10 mm, about 1 µm to 5 mm, about 1 µm to 1 mm, about 1 µm to 500 µm, or about 5 µm to about 500 µm, or about 10 µm to 500 µm, or about 1 µm to about 100 µm. The length of fiber actuators 100 can be on the order of microns to millimeters to centimeters to meters, depending on the ultimate application and use of the fiber actuator.

Additional examples of compositions useful as polymer layer 104 include piezoelectric polymers and shape memory polymers. Exemplary piezoelectric materials include, but are not limited to, barium titanate, hydroxyapatite, apatite, lithium sulfate monohydrate, sodium potassium niobate, quartz, lead zirconium titanate (PZT), tartaric acid and polyvinylidene difluoride fibers. Other piezoelectric materials known in the art can also be used in the embodiments described herein.

Shape memory polymers (SMP) allow for programming of the polymer providing it with the ability to change shape from a first to a second shape. The shape-memory effect is not an intrinsic property, meaning that polymers do not display this effect by themselves. Shape memory results from a combination of polymer morphology and specific processing and can be understood as a polymer functionalization. By conventional processing, e.g. extruding or injection molding, the polymer is formed into its initial, permanent shape B. Afterwards, in a process called programming, the polymer sample is deformed and fixed into the temporary shape A. Upon application of an external stimulus (e.g., heat or electric field), the polymer recovers its initial permanent shape B. This cycle of programming and recovery can be repeated several times, with different temporary shapes in subsequent cycles. Shape-memory polymers can be elastic polymer networks that are equipped with suitable stimuli-sensitive switches. The polymer network consists of molecular switches and net points. The net points determine the permanent shape of the polymer network and can be a chemical (covalent bonds) or physical (intermolecular interactions) nature. Physical cross-linking is obtained in a polymer whose morphology consists of at least two segregated domains, as found for example in block copolymers. Additional information and examples of SMPs can be found in Shape Memory Polymers, *Materials Today*, Vol. 10, pages 20-28 (April 2007), the disclosure of which is incorporated by reference herein in its entirety.

Transformation of SMPs from one or a first configuration to another or a second configuration is suitably controlled by controlling the temperature of the SMP in relation to its glass transition temperature (Tg). Raising the temperature of the SMP by heating it above its Tg, will cause the SMP actuator to transition to its second (memorized or original) configuration, resulting in activation or actuation of the multi-stable material and moving or transforming from a first stable configuration to a second stable configuration, and suitably to a third (and fourth, fifth etc., if desired) stable configuration. Exemplary shape memory polymers include various block copolymers, such as various poly(urethanes), poly (isoprene) and poly(ether esters), which have been programmed to have the required shape memory characteristics.

In the fiber actuators described herein, polymeric layer 104 is suitably a soft polymer, including for example an electroactive polymer, or a shape memory polymer, configured to deform so as to provide haptic feedback. As used herein "configured to deform" means that he polymer is shaped, formed, oriented or otherwise structured in the fiber actuator so as to be able to move, change shape, vibrate, elongate, contract, etc., so as to provide haptic feedback as the fiber actuator moves, changes shape, vibrates, elongates, contracts, etc. The malleability or flexibility of the polymer layer allows for it to deform or change shape in response to an electric field (and heating if required) applied between the first and second conductive elements. For example, polymeric layer 104 can contract, causing the fiber actuator to shrink or deform in shape, or can expand, causing the fiber actuator to extend, contract or otherwise deform in shape. In general, the amount of movement or deformation of fiber actuators in response to an electric field will be on the order of a few percent (0.5-5%) of the total diameter and/or length of the fiber actuator.

In exemplary embodiments, as shown in FIG. 2A, fiber actuator 100 can be associated with a structural material 210, so as to form a smart material 200. In exemplary embodiments, structural material 210 can be a textile, including part of a wearable, as described herein.

Thus, in embodiments, provided herein are smart materials for providing haptic feedback to a user. Exemplary smart materials 200 include, for example, structural material 210 and fiber actuator 100 associated with the structural material. As described herein, fiber actuator 100 can include first conductive element (102 if hollow fiber or 102' if solid core fiber) polymeric layer 104 concentrically disposed about the first conductive element and configured to deform so as to provide haptic feedback, and second conductive element 106 concentrically disposed about the polymeric layer. As described through, the fiber actuator has a substantially uniform cross-section, and in embodiments, a substantially circular cross-section, for substantially an entire length of the fiber. Exemplary materials for use as the conductive elements and the polymeric layers are described herein.

Various mechanisms for associating or attaching fiber actuator 100 to structural material 210 can be used. For example, fiber actuator 100 can be integrated into structural material 210. Fiber actuator 100 can be made part of structural material 210 during formation of structural material 210, such as during weaving or sewing of a textile, etc. That is, fiber actuator 100 can be directly sewn or weaved into a textile or fabric, for example, between two pieces of a textile, or as part of the structure of a structural material, including a textile, thereby integrating the fiber actuator into the structural material.

In additional embodiments, fiber actuator 100 can be fixedly attached to structural material 210. In such embodiments, fiber actuator 100 can be glued, taped, stitched, adhered, stapled, tacked, or otherwise attached to structural material 210. Fiber actuator 100 can also be integrated into, or on, various substrates, e.g., polymers such as rubbers, silicones, silicone elastomers, Teflon, or poly(ethylene terephthalate), etc., in the form of patches, ribbons or tapes that can then be attached to structural material 210 (e.g., adhered or sewn).

In integrating fiber actuators into structural material 210, it is generally desirable to orient the fiber actuators in a parallel or other orientation such that when activated, their movement in concert results in movement of the structural material, rather than cancelling out their changes in shape or size. In other embodiments, two sets of two-dimensional fiber sections can be prepared, however, and oriented in a perpendicular manner. In such embodiments, a first set of fibers (or a mesh of fibers) can be actuated to provide actuation in a desired direction, followed by actuating the fibers in a second direction (including a perpendicular direction), and still provide the desired actuation.

The number and concentration of fiber actuators 100 in structural material 210 will vary depending on the application and type of structural material 210 or smart material 200, but is in general on the order of one fiber actuator per square centimeter or one fiber actuator per square inch, but can be included at a higher density, e.g., on the order of 10's of fibers per square centimeter or square inch.

As described herein, power source 208 can be connected to fiber actuator 100, and suitably to one or both of the first and second conductive elements. In embodiments, power source 208 can be permanently connected to fiber actuator 100, or in other embodiments, can be separate from the fiber actuator, and later connected. In embodiments where the fiber actuator is part of a structural material, i.e., a wearable, the power source can be physically associated with the wearable, and attached as desired or required, to fiber actuator 100.

The amount of power provided by power source 208 is suitably on the order of about 0.1 Watts (W) to about 10 W, or more suitably about 0.5 W to about 5 W, or about 1 W to about 5 W, or about 0.5 W, about 1 W, about 2 W, about 3 W, about 4 W or about 5 W. Exemplary power sources 208 including various battery packs as well as solar energy sources. Power source 208 can also include a re-chargeable system, for example, a system capable of recharging through the use of a piezoelectric material.

As described herein, in embodiments, polymeric layer 104 deforms in response to an electric field between first conductive element 102/102' and second conductive element 106. This can result in compression or expansion of polymeric layer 104, depending on the type of polymer selected, thereby providing motion or deformation of the fiber actuator. For example, as shown in FIG. 2A, fiber actuator 100 can move or deform in a lateral direction 204 (i.e., across the width or diameter of the fiber actuator), and/or a longitudinal direction 202 (i.e., along the length of the fiber actuator). The deformation of fiber actuator 100 can result in movement or deformation of structural material 210, for example, as shown in FIG. 2B, as the structural material changes shape, moves, or otherwise deforms, thereby providing haptic feedback to a user (mechanical haptic feedback).

As shown in FIG. 1B and FIG. 1C, fiber actuator 100 can further include an insulator layer 108, concentrically disposed about the second conductive element 106. As shown in FIG. 1A, insulator layer 108 can cover over at least a segment of the length of fiber actuator 100. Thus, as shown in FIG. 1A, fiber actuator 100 can include portions of the fiber, where the outer most layer is insulator layer 108, and other sections, where the outer most layer is second conductive element 106.

Examples of material useful in forming insulator layer 108 include for example, polymeric materials, rubbers, plastics, ceramics etc. In embodiments, the materials selected for insulator layer 108 are suitably thin materials, on the order of 0.5 µm to 10 mm in thickness, more suitably about 0.5 µm to 1 mm, about 0.5 µm to 100 µm, or about 0.5 µm to 10 µm, and are selected so as to be flexible such that when fiber actuator 100 is part of a textile or fabric, including as a wearable, the materials can bend and conform to the various shapes necessary during wearing by a user, while still providing the desired haptic feedback.

In embodiments where fiber actuator 100 comprises insulator 108, the fiber actuator can provide electrostatic feedback or an electrostatic interaction (i.e., non-mechanical haptic feedback) to a user, over the section or length of the fiber actuator that includes the insulator.

Upon interaction with fiber actuator 100 that includes insulator 108, and/or smart material 200 which includes fiber actuator 100 that includes insulator 108, for example via a user touch, haptic feedback can be provided via an electrostatic interaction or electrostatic feedback to the user. The electrostatic feedback can be in the form of a short vibration or pulse, or an extended vibration to the user. The frequency of the electrostatic feedback or interaction can be on the order of about 1 Hz to about 1000 Hz, more suitably about 1 Hz to about 500 Hz, about 1 Hz to about 200 Hz, about 10 Hz to about 200 Hz, about 10 Hz to about 100 Hz, or about 10 Hz, about 20 Hz, about 30 Hz, about 40 Hz, about 50 Hz, about 60 Hz, about 70 Hz, about 80 Hz, about 90 Hz or about 100 Hz. Haptic feedback can also be provided by the electrostatic interaction if a user simply approaches, or is near, the smart material or the fiber actuator, signaling a close proximity to the smart material, which may result in the electrostatic interaction and the haptic feedback therefrom.

In embodiments, for example as shown in FIG. 1A, fiber actuator 100 can include both sections that have insulator 108, and sections that do not have insulator 108. Fiber actuators that have both sections can thus provide both an electrostatic interaction or electrostatic feedback (non-mechanical), as well as haptic feedback resulting from the deformation, movement or change in shape (mechanical) of fiber actuator 100.

In additional embodiments, smart material 200 can include fiber actuators that include insulator 108, and fiber actuators that lack insulator 108, in the same smart material. In such embodiments, the smart material can provide feedback via both electrostatic interaction or electrostatic feedback and haptic feedback resulting from the deformation, movement or change in shape of fiber actuator 100. Smart material 200 can comprise sections that include primarily one type of fiber actuator (e.g., lacking insulator 108) and sections that include primarily another type of fiber actuator (e.g., including insulator 108), thereby providing distinct sections of smart material 200 that provide different types of haptic feedback. In further embodiments, the fiber actuators can be distributed throughout the smart material so that both movement/deformation-based haptic feedback and electrostatic-based haptic feedback can be provided in the same area of the smart material.

In embodiments in which electrostatic interactions are produced or provided, power source 208, which is connected to first (102 or 102') and/or second conductive element 106, is also suitably connected to ground. In embodiments, first conductive element 102/102' can act as ground, with second conductive element being connected to power source 208 to provide electrostatic feedback to a user when the user contacts insulator layer 108. In additional embodiments, a user's body (e.g., arm, leg, torso, head, neck, etc.) can act as a ground for the electrostatic interaction, whereby the haptic feedback is provided or felt via the user's touch (or close approach). In further embodiments, a user's touch can act as ground for the electrostatic interaction, whereby the haptic feedback is provided or felt via the user's body, rather than through user's touch (or close approach). In still further embodiments, the haptic feedback in the form of an electrostatic interaction can be felt by either, or both, user's body and/or user's touch.

As described herein, in embodiments, smart material 200, and thus structural material 210, can be incorporated into or be part of wearable articles, such as, textiles, including shirts, blouses, hats, jackets, coats and pants/shorts, resulting in a wearable smart material. The structural materials can also be integrated into accessories, including various leather goods, including wallets and purses, handbags (including handles of such), backpacks, and jewelry, etc.

In additional embodiments, provided herein are methods for providing haptic feedback to a user via fiber actuator 100. Exemplary methods include providing fiber actuator 100, which includes providing smart material 200, including fiber actuator 100 associated with or integrated into structural material 210, for example, as part of a wearable, accessory good, etc. As described herein, fiber actuator 100 can include first conductive element (102 if hollow fiber or 102' if solid core fiber) polymeric layer 104 concentrically disposed about the first conductive element, and second conductive element 106 concentrically disposed about the polymeric layer. As described through, the fiber actuator has a substantially circular cross-section over substantially an entire length of the fiber. Exemplary materials for use as the conductive elements and polymeric layers are described herein.

The methods further comprise transmitting an actuation signal 206, for example, as illustrated in FIG. 2A, to power source 208, which is electrically coupled to fiber actuator 100. The methods further comprise generating haptic feedback via the fiber actuator.

As described through, in embodiments, generating haptic feedback includes generating an electric field between first conductive element (102 or 102') and second conductive element 106, resulting in deformation of polymeric layer 104. In exemplary embodiments, polymeric layer 104, which can be an electroactive polymer or a smart polymer, deforms, moves, changes shape, or otherwise reacts to the electric field causing movement of the fiber actuator, and in embodiments, movement of structural material 210, thereby providing haptic feedback to a user. The polymeric layer 104 can also deform or change shape in response to a change in temperature which results from the generation of the electric field. Such movement and haptic feedback is "mechanical" in nature, in that it is felt by the user as a movement, vibration or deformation of the fiber actuator, and thus the smart material/structural material.

In still further embodiments where fiber actuator 100 includes insulator layer 108 disposed about second conductive 106 element over at least a segment of the length of the fiber actuator, the generating haptic feedback includes generating an electrostatic feedback to the user. This electrostatic feedback can occur as a user interacts with the fiber actuator or the structural material, including both direct contact and close contact with the fiber actuator or the structural material. This electrostatic feedback is non-mechanical in nature as it results from electrostatic forces, rather than physical movement or deformation.

Exemplary actuation signals 206 can be from a cellular phone, tablet, computer, car interface, smart device, game console, etc., and can indicate for example the receipt of a text message or e-mail, phone call, appointment, etc.

In further embodiments, a controller is also suitably included to provide an interface between a device, including an external device, and smart materials 200 and/or fiber actuators 100, as described herein. Components of a controller are well known in the art, and suitably include a bus, a processor, an input/output (I/O) controller and a memory, for example. A bus couples the various components of controller, including the I/O controller and memory, to the processor. The bus typically comprises a control bus, address bus, and data bus. However, the bus can be any bus or combination of busses suitable to transfer data between components in the controller.

A processor can comprise any circuit configured to process information and can include any suitable analog or digital circuit. The processor can also include a programmable circuit that executes instructions. Examples of programmable circuits include microprocessors, microcontrollers, application specific integrated circuits (ASICs), programmable gate arrays (PGAs), field programmable gate arrays (FPGAs), or any other processor or hardware suitable for executing instructions. In the various embodiments, the processor can comprise a single unit, or a combination of two or more units, with the units physically located in a single controller or in separate devices.

An I/O controller comprises circuitry that monitors the operation of the controller and peripheral or external devices. The I/O controller also manages data flow between the controller and peripherals or external devices. Examples of peripheral or external devices with the which I/O controller can interface include switches, sensors, external storage devices, monitors, input devices such as keyboards, mice or pushbuttons, external computing devices, mobile devices, and transmitters/receivers.

The memory can comprise volatile memory such as random access memory (RAM), read only memory (ROM), electrically erasable programmable read only memory (EEPROM), flash memory, magnetic memory, optical memory or any other suitable memory technology. Memory can also comprise a combination of volatile and nonvolatile memory.

The memory is configured to store a number of program modules for execution by the processor. The modules can, for example, include an event detection module, an effect determination module, and an effect control module. Each program module is a collection of data, routines, objects, calls and other instructions that perform one or more particular task. Although certain program modules are disclosed herein, the various instructions and tasks described for each module can, in various embodiments, be performed by a single program module, a different combination of modules, modules other than those disclosed herein, or modules executed by remote devices that are in communication with the controller.

In embodiments described herein, the controller, which can include a wireless transceiver (including a Bluetooth or infrared transceiver), can be integrated into structural material 210 or can be separate from the structural material. In further embodiments, the controller can be on a separate device from the structural material, but is suitably connected via a wired or more suitably a wireless signal, so as to provide actuation signal 206 to the fiber actuators, power sources, and smart materials described herein.

For example, the controller can provide actuation signal 206 to an actuator drive circuit, which in turn communicates with power supply 208, of the smart materials or fiber actuators described herein, so as to provide haptic feedback to a user of a smart material or system as described herein. For example, desired haptic feedback can occur, for example, when a mobile phone or other device to which a controller is paired via wireless connection receives a message or email. Additional examples include a controller being associated with devices such as game controllers, systems or consoles, computers, tablets, car or truck interfaces or computers, a health monitoring device, automated payment machines or kiosks, various keypad devices, televisions, various machinery, etc. In such embodiments, the controller suitably provides actuation signal 206 to an actuator drive circuit, to provide haptic feedback to a user in response to a signal originated by or from an external device. The device can also be a part of the wearable on which the various components of the haptic feedback systems described herein are contained. For example, the fiber actuators described herein can be made part of a watch band, where the face of the watch is a smart watch, for example, and the user sets the watch to provide haptic feedback via the fiber actuators integrated into the band (i.e., vibrate, motion, contraction etc., based on a received e-mail, alarm, other notification). Exemplary feedback or signals that can be provided by a device, include, for example, indications of incoming messages or communication from a third party, warning signals, health status updates (i.e., blood pressure or heart palpitations), gaming interaction, driver awareness signals, computer prompts, etc.

In further embodiments, the smart materials and components described herein can be integrated with or be part of a virtual reality or augmented reality system. In such embodiments, the smart materials can provide haptic feedback to a user as he or she interacts with a virtual or augmented reality system, providing responses or feedback initiated by the virtual reality or augmented reality components and devices.

In further embodiments, the interaction between the user, fiber actuator 100 and an external device can occur via direct interaction between the user and fiber actuator 100 or smart material 200, which in turn provides a signal to an external device. For example, a user can interact with a smart material in the form of a wearable on the user's body, by touching, swiping, pressing or otherwise touching the structural material of the wearable, which suitably includes the fiber actuators described herein. This interaction can result in a signal being transferred to an external device, demonstrating or confirming a user interaction has taken place.

In embodiments of the methods described herein, the actuation signal(s) described herein is transmitted to the power source. Movement is then generated in the fiber actuator, resulting in actuation of the structural material. In addition, an electrostatic interaction can also be generated upon user interaction, in embodiments where the fiber actuator is designed to provide electrostatic feedback. The combination of the movement of the fiber actuator, and/or the electrostatic interaction, provides haptic feedback to the user. In various embodiments, the order, sequence, frequency, and intensity of both the movement of the fiber actuator and electrostatic interaction can be varied, depending on the type of interaction or the type of desired feedback.

For example, in embodiments, a user may experience haptic feedback from the movement of the fiber actuator, upon which the user may interact with the fiber actuator, or other fiber actuators in the smart material, creating an electrostatic interaction which provides additional, further haptic feedback. In further embodiments, the user may interact with the structural material, which in turn provides an electrostatic interaction, and the structural material may further provide movement from the fiber actuator to provide the haptic feedback. In further embodiments, the user can interact with a first fiber actuator, which provides a motion-based or mechanical haptic feedback indicating that the interaction has been successful, followed by an electrostatic interaction (non-mechanical feedback) from a second fiber actuator, indicating that, for example, a desired task has been completed.

Examples of intensity, frequency and timing of the various haptic feedback are provided herein, and can be tailored as desired by the user or the device with which the user is interacting. Examples of devices and methods for activating or actuating the combined smart materials are described herein, and include various computers, mobile devices, gaming systems, automobiles, etc.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A method for providing a signal to an external device, the method comprising:
   receiving a user interaction via a smart material comprising a fiber actuator, the fiber actuator comprising:
   a first conductive element;
   a polymeric layer concentrically disposed about the first conductive element and configured to deform so as to provide haptic feedback;
   a second conductive element concentrically disposed about the polymeric layer; and
   an insulator layer concentrically disposed about the second conductive element over at least a portion of a length of the fiber actuator,
   wherein the fiber actuator has a substantially circular cross-section substantially along an entire length of the fiber actuator, and
   transferring the signal from the smart material to the external device, thereby confirming receipt of the user interaction via the smart material.

2. The method of claim 1, wherein the first conductive element forms a solid core of the fiber actuator.

3. The method of claim 1, wherein the first conductive element forms a hollow core of the fiber actuator.

4. The method of claim 1, wherein the polymeric layer comprises an electroactive polymer selected from a group comprising poly(vinylidene fluoride), poly(pyrrole), poly(thiophene), poly(aniline) and mixtures, co-polymers, and derivatives of these electroactive polymers.

5. The method claim 1, wherein the polymeric layer comprises a shape memory polymer.

6. The method of claim 1, wherein the smart material is part of a wearable smart material.

7. The method of claim 1, wherein the interacting comprises the user touching, swiping or pressing the smart material.

8. The method of claim 1, further comprising:
transmitting an actuation signal from the external device to a power source electrically coupled to the fiber actuator; and
generating the haptic feedback via the fiber actuator.

9. The method of claim 8, wherein the generating comprises generating an electric field between the first conductive element and the second conductive element, resulting in a deformation of the polymeric layer.

10. The method of claim 8, wherein the generating comprises generating an electrostatic feedback to a user over at least the portion of the length comprising the insulator layer.

11. The method of claim 8, wherein the transferring the signal from the smart material to the external device occurs before the generating haptic feedback via the fiber actuator.

12. The method of claim 8, wherein the transferring the signal from the smart material to the external device occurs after the generating haptic feedback via the fiber actuator.

13. The method of claim 1, wherein the external device is a computer, a mobile device, a gaming system, a virtual or augmented reality system, or an automobile.

* * * * *